(12) United States Patent
Su et al.

(10) Patent No.: US 9,431,407 B2
(45) Date of Patent: Aug. 30, 2016

(54) METHOD OF MAKING EMBEDDED MEMORY DEVICE WITH SILICON-ON-INSULATOR SUBSTRATE

(71) Applicant: Silicon Storage Technology, Inc., San Jose, CA (US)

(72) Inventors: Chien-Sheng Su, Saratoga, CA (US); Hieu Van Tran, San Jose, CA (US); Mandana Tadayoni, Cupertino, CA (US); Nhan Do, Saratoga, CA (US); Jeng-Wei Yang, Zhubei (TW)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/491,596

(22) Filed: Sep. 19, 2014

(65) Prior Publication Data

US 2016/0086962 A1 Mar. 24, 2016

(51) Int. Cl.
| | |
|---|---|
| *H01L 21/00* | (2006.01) |
| *H01L 21/84* | (2006.01) |
| *H01L 27/115* | (2006.01) |
| *H01L 29/66* | (2006.01) |
| *H01L 29/06* | (2006.01) |
| *H01L 29/423* | (2006.01) |
| *H01L 21/306* | (2006.01) |
| *H01L 21/762* | (2006.01) |
| *H01L 21/28* | (2006.01) |
| *H01L 27/12* | (2006.01) |

(52) U.S. Cl.
CPC ... *H01L 27/11531* (2013.01); *H01L 21/28273* (2013.01); *H01L 21/30604* (2013.01); *H01L 21/7624* (2013.01); *H01L 21/76224* (2013.01); *H01L 27/11521* (2013.01); *H01L 27/11534* (2013.01); *H01L 27/1207* (2013.01); *H01L 29/0649* (2013.01); *H01L 29/42328* (2013.01); *H01L 29/66825* (2013.01)

(58) Field of Classification Search
None
See application file for complete search history.

(56) References Cited

U.S. PATENT DOCUMENTS

| | | | |
|---|---|---|---|
| 4,771,016 A | 9/1988 | Bajor et al. | |
| 5,061,642 A | 10/1991 | Fujioka | |
| 5,417,180 A | 5/1995 | Nakamura | |
| 5,888,297 A | 3/1999 | Ogura | |
| 6,338,993 B1 * | 1/2002 | Lien | H01L 27/10894 257/E21.654 |
| 6,403,486 B1 | 6/2002 | Lou | |
| 6,747,310 B2 | 6/2004 | Fan et al. | |
| 7,049,661 B2 | 5/2006 | Yamada et al. | |

(Continued)

*Primary Examiner* — Mohammad Islam
*Assistant Examiner* — Jay C Chang
(74) *Attorney, Agent, or Firm* — DLA Piper LLP (US)

(57) ABSTRACT

A method of forming a semiconductor device starts with a substrate of silicon, a first insulation layer on the silicon, and a silicon layer on the first insulation layer. The silicon layer and the insulation layer are removed just from a second substrate area. A second insulation layer is formed over the silicon layer in the substrate first area and over the silicon in the second substrate area. A first plurality of trenches is formed in the first substrate area that each extends through all the layers and into the silicon. A second plurality of trenches is formed in the second substrate area that each extends through the second insulation layer and into the silicon. An insulation material is formed in the first and second trenches. Logic devices are formed in the first substrate area, and memory cells are formed in the second substrate area.

10 Claims, 16 Drawing Sheets

(56) References Cited

U.S. PATENT DOCUMENTS

| | | |
|---|---|---|
| 7,868,375 B2 | 1/2011 | Liu et al. |
| 7,927,994 B1 | 4/2011 | Liu et al. |
| 9,202,761 B2 | 12/2015 | Makiyama et al. |
| 2004/0156236 A1* | 8/2004 | Masuoka .............. H01L 27/115 365/185.17 |
| 2005/0045951 A1 | 3/2005 | Yamada et al. |
| 2012/0181609 A1* | 7/2012 | Enders .................... H01L 21/84 257/351 |
| 2013/0087855 A1 | 4/2013 | Makiyama et al. |

* cited by examiner

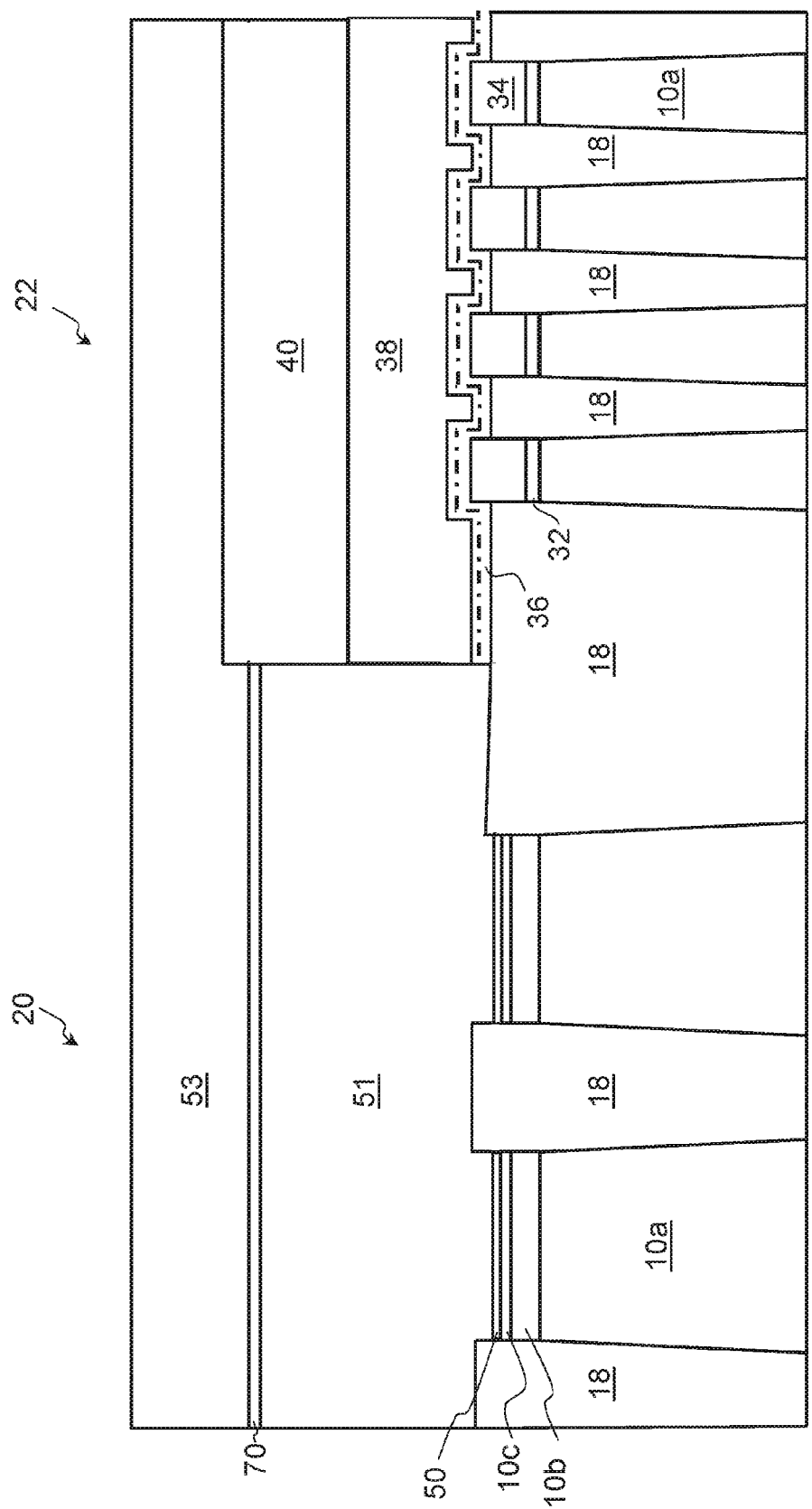

METHOD OF MAKING EMBEDDED MEMORY DEVICE WITH SILICON-ON-INSULATOR SUBSTRATE

FIELD OF THE INVENTION

The present invention relates to embedded non-volatile memory devices.

BACKGROUND OF THE INVENTION

Non-volatile memory devices formed on bulk silicon semiconductor substrates are well known. For example, U.S. Pat. Nos. 6,747,310, 7,868,375 and 7,927,994 disclose memory cells with four gates (floating gate, control gate, select gate and erase gate) formed on a bulk semiconductor substrate. Source and drain regions are formed as diffusion implant regions into the substrate, defining a channel region therebetween in the substrate. The floating gate is disposed over and controls a first portion of the channel region, the select gate is disposed over and controls a second portion of the channel region, the control gate is disposed over the floating gate, and the erase gate is disposed over the source region. Bulk substrates are ideal for these type of memory devices because deep diffusions into the substrate can be used for forming the source and drain region junctions. These three patents are incorporated herein by reference for all purposes.

Silicon on insulator (SOI) devices are well known in the art of microelectronics. SOI devices differ from bulk silicon substrate devices in that the substrate is layered with an embedded insulating layer under the silicon surface (i.e. silicon-insulator-silicon) instead of being solid silicon. With SOI devices, the silicon junctions are formed in a thin silicon layer disposed over the electrical insulator that is embedded in the silicon substrate. The insulator is typically silicon dioxide (oxide). This substrate configuration reduces parasitic device capacitance, thereby improving performance. SOI substrates can be manufactured by SIMOX (separation by implantation of oxygen using an oxygen ion beam implantation—see U.S. Pat. Nos. 5,888,297 and 5,061,642), wafer bonding (bonding oxidized silicon with a second substrate and removing most of the second substrate—see U.S. Pat. No. 4,771,016), or seeding (topmost silicon layer grown directly on the insulator—see U.S. Pat. No. 5,417, 180). These four patents are incorporated herein by reference for all purposes.

It is known to form core logic devices such as high voltage, input/output and/or analog devices on the same substrate as non-volatile memory devices (i.e. typically referred to as embedded memory devices). As device geometries continue to shrink, these core logic devices could benefit greatly from the advantages of SOI substrates. However, the non-volatile memory devices are not conducive to SOI substrates. There is a need to combine the advantages of core logic devices formed on an SOI substrate with memory devices formed on bulk substrates.

BRIEF SUMMARY OF THE INVENTION

A method of forming a semiconductor device includes providing a substrate that includes silicon, a first insulation layer directly over the silicon, and a layer of silicon directly over the first insulation layer. An etch process is performed to remove the layer of silicon and the insulation layer from a second area of the substrate, while maintaining the first insulation layer and the silicon layer in a first area of the substrate. A second layer of insulation is formed over the layer of silicon in the first area of the substrate and over the silicon in the second area of the substrate. A first plurality of trenches is formed in the first area of the substrate that each extends through the second layer of insulation, the layer of silicon, and the first insulation layer, and extends into the silicon. A second plurality of trenches is formed in the second area of the substrate that each extends through the second layer of insulation, and extends into the silicon. An insulation material is formed in the first and second pluralities of trenches. Logic devices are in the first area of the substrate. The forming of each of the logic devices includes forming spaced apart source and drain regions in the silicon layer, and forming a conductive gate over and insulated from a portion of the silicon layer and between the source and drain regions. Memory cells are formed in the second area of the substrate by forming spaced apart second source and second drain regions in the silicon and defining a channel region therebetween, forming a floating gate over and insulated from a first portion of the channel region, and forming a select gate over and insulated from a second portion of the channel region.

Other objects and features of the present invention will become apparent by a review of the specification, claims and appended figures.

BRIEF DESCRIPTION OF THE DRAWINGS

FIGS. 1-7, 8A, 9A,10A,10C and 11A are side cross sectional views of the core logic area and memory area illustrating in sequence the processing steps performed to manufacture the embedded memory device of the present invention.

DETAILED DESCRIPTION OF THE INVENTION

Figure 1:
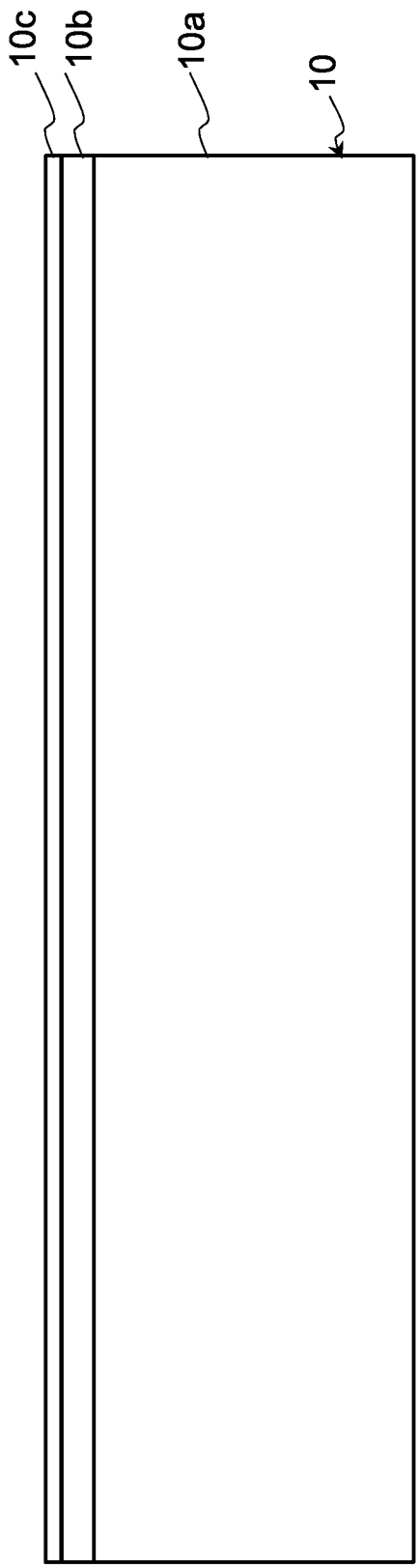

The present invention is an embedded memory device with non-volatile memory cells formed alongside core logic devices on an SOI substrate. The embedded insulator is removed from the memory area of the SOI substrate in which the non-volatile memory is formed. The process of forming embedded memory devices on an SOI substrate begins by providing an SOI substrate 10, as illustrated in FIG. 1. The SOI substrate includes three portions: silicon 10a, a layer of insulating material 10b (e.g. oxide) over the silicon 10a, and a thin layer of silicon 10c over the insulator layer 10b. Forming SOI substrates is well known in the art as described above and in the U.S. patents identified above, and therefore is not further described herein.

Figure 2:
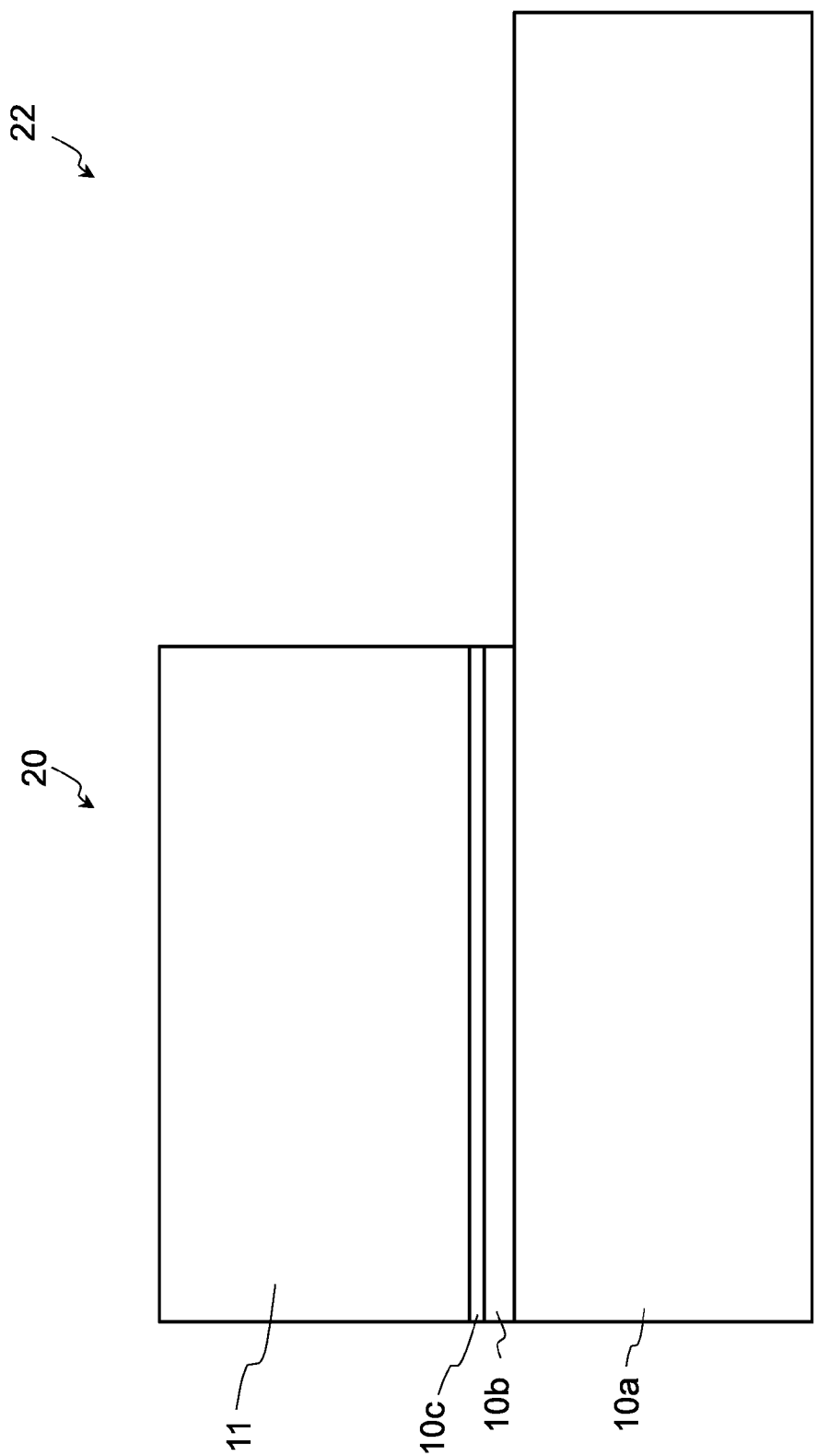
Figure 3:
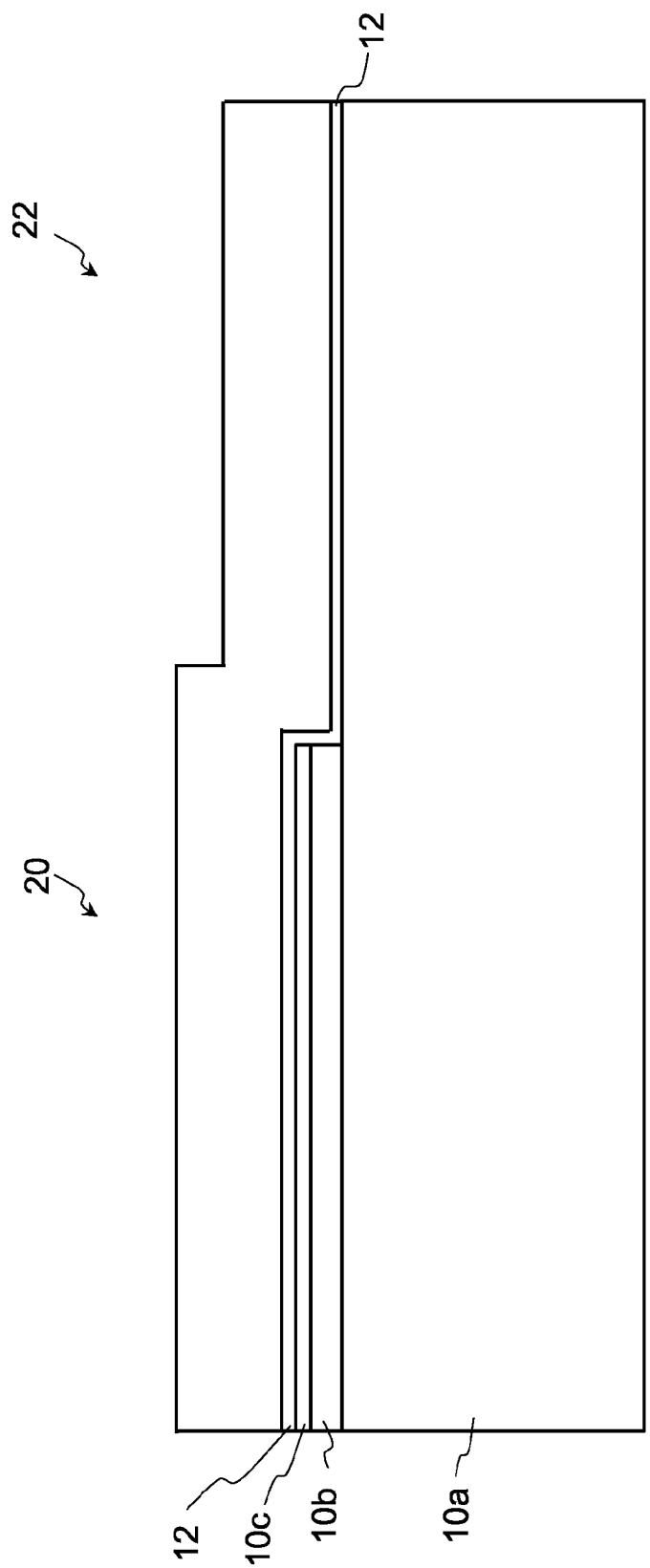

A photolithography process is performed which includes forming a photo-resist material 11 on silicon 10c, followed by selectively exposing the photo-resist material to light using an optical mask, which is followed by selectively removing portions of the photo-resist material to expose portions of silicon 10c (in memory area 22). Photolithography is well known in the art. Silicon and oxide etches are then performed in those exposed areas (memory area 22) to remove silicon 10c and oxide 10b (leaving silicon 10c and oxide 10b intact in core logic area 20), as shown in FIG. 2. After photo resist 11 is removed, a first layer of insulation material 12, such as silicon dioxide (oxide), is formed on the silicon 10c in the core logic area 20 and on silicon 10a in the memory area 22. Layer 12 can be formed, for example, by oxidation or by deposition (e.g. chemical vapor deposition CVD). A second layer of insulation material 14, such as silicon nitride (nitride) is formed on layer 12 in both logic core area 20 and memory area 22, as illustrated in FIG. 3.

Figure 4:
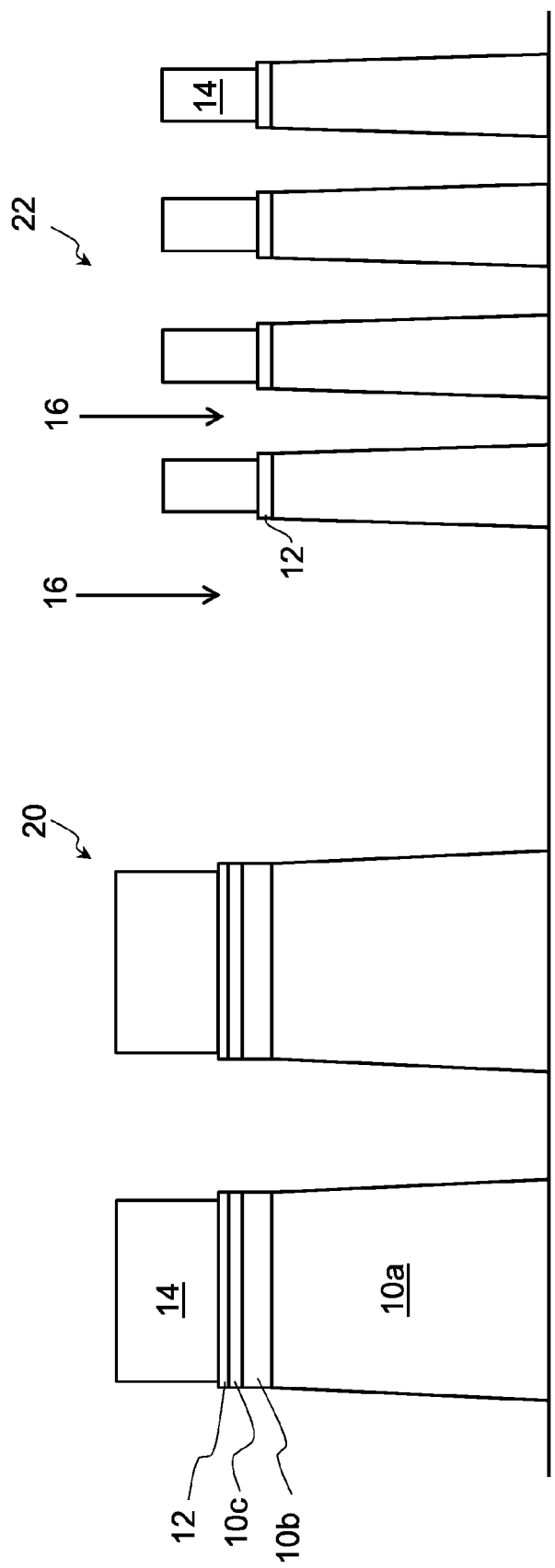
Figure 5:
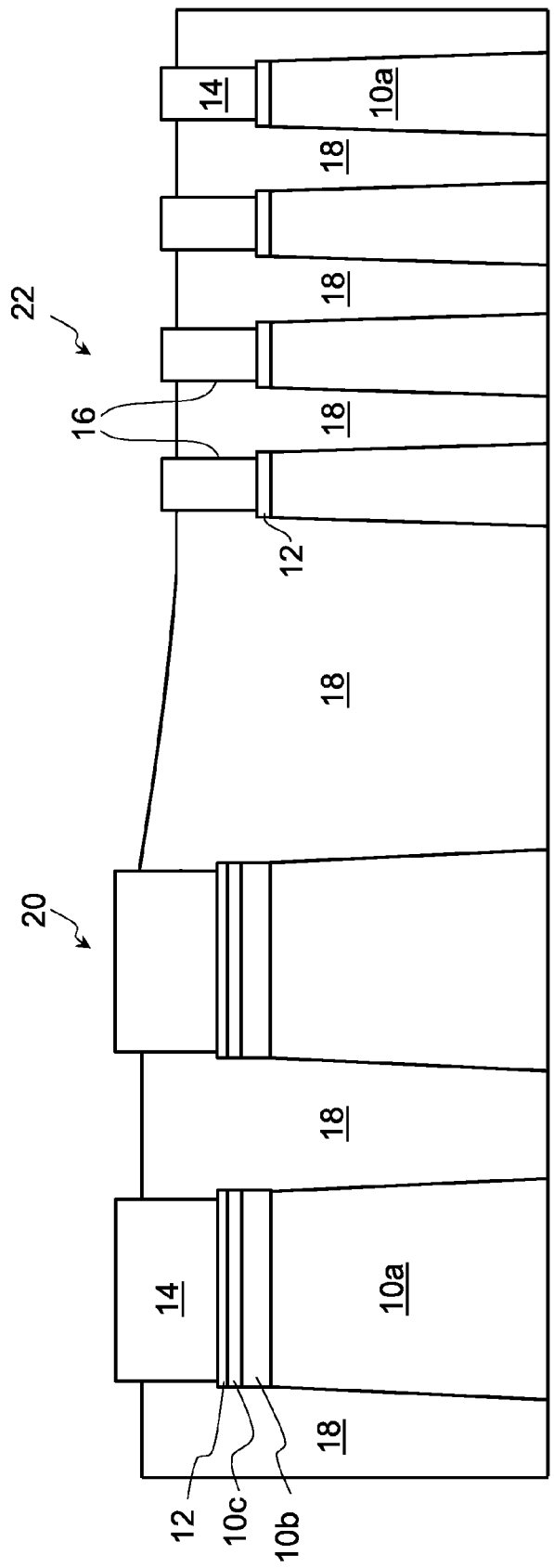

A photolithography process is next performed which includes forming a photo-resist material on nitride 14, followed by selectively exposing the photo-resist material to light using an optical mask, which is following by selectively removing portions of the photo-resist material to selectively expose portions of nitride layer 14. A series of etches are then performed in those exposed areas to remove nitride 14, oxide 12, silicon 10c, oxide 10b and silicon 10a (i.e. nitride etch to expose oxide 12, oxide etch to expose silicon 10c, silicon etch to expose oxide 10b, oxide etch to expose silicon 10a, and a silicon etch) to form trenches 16 that extend down through layers 14, 12, 10c, 10b and into silicon 10a. The photo-resist material is then removed, resulting in the structure shown in FIG. 4. The trenches 16 are then filled with an insulating material 18 (e.g. oxide) by an oxide deposition and oxide etch (e.g. chemical mechanical polish, CMP, using nitride 14 as an etch stop), resulting in the structure shown in FIG. 5. Insulating material 18 serves as isolation regions for both the core logic area 20 and memory area 22 of the substrate 10.

Figure 6:
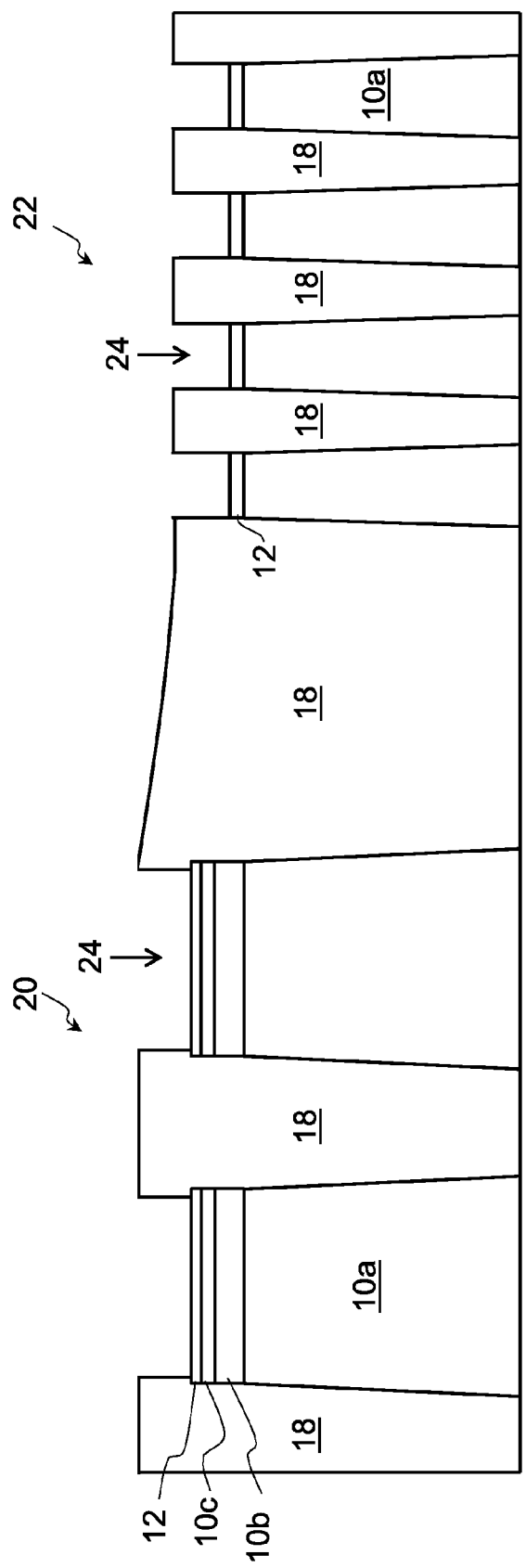
Figure 7:
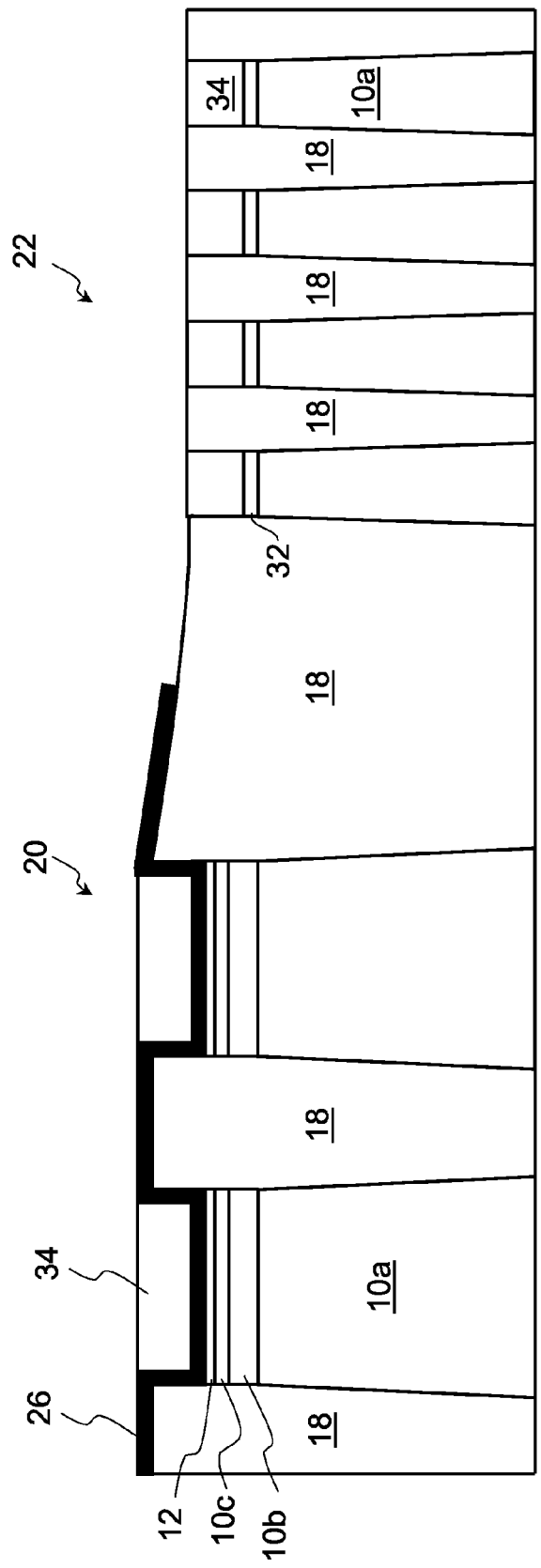

A nitride etch is next performed to remove nitride 14 (leaving trenches 24 between the pillars of oxide 18), as illustrated in FIG. 6. A layer of insulation material 26 (e.g. nitride) is formed over exposed surfaces of the structure by, for example, nitride deposition. A photolithography process is performed to form photo-resist over the structure, followed by a masking step in which the photo resist is removed from the memory area 22 but not the core logic area 20 of the structure. A nitride etch is performed to remove nitride layer 26 from the memory area 22. After photo-resist is removed, an oxide etch is performed to remove oxide layer 12 at the bottoms of trenches 24 in memory area 22. The oxide etch also reduces the height of oxide 18 in the memory area 22. An oxide formation step (e.g. oxidation) is then used to form oxide layer 32 on substrate 10a in the memory area 22 (which will be the oxide on which the floating gate will be formed). Polysilicon is formed over the structure, followed by a poly removal (e.g. CMP), leaving poly layer 34 in the trenches 24 in both the core logic area 20 and the memory area 22. Preferably, but not necessarily, the top surfaces of poly 34 and oxide 18 in the memory area 22 are co-planar (i.e. use oxide 18 as the etch stop for the poly removal). The resulting structure is shown in FIG. 7.

Figure 8A:
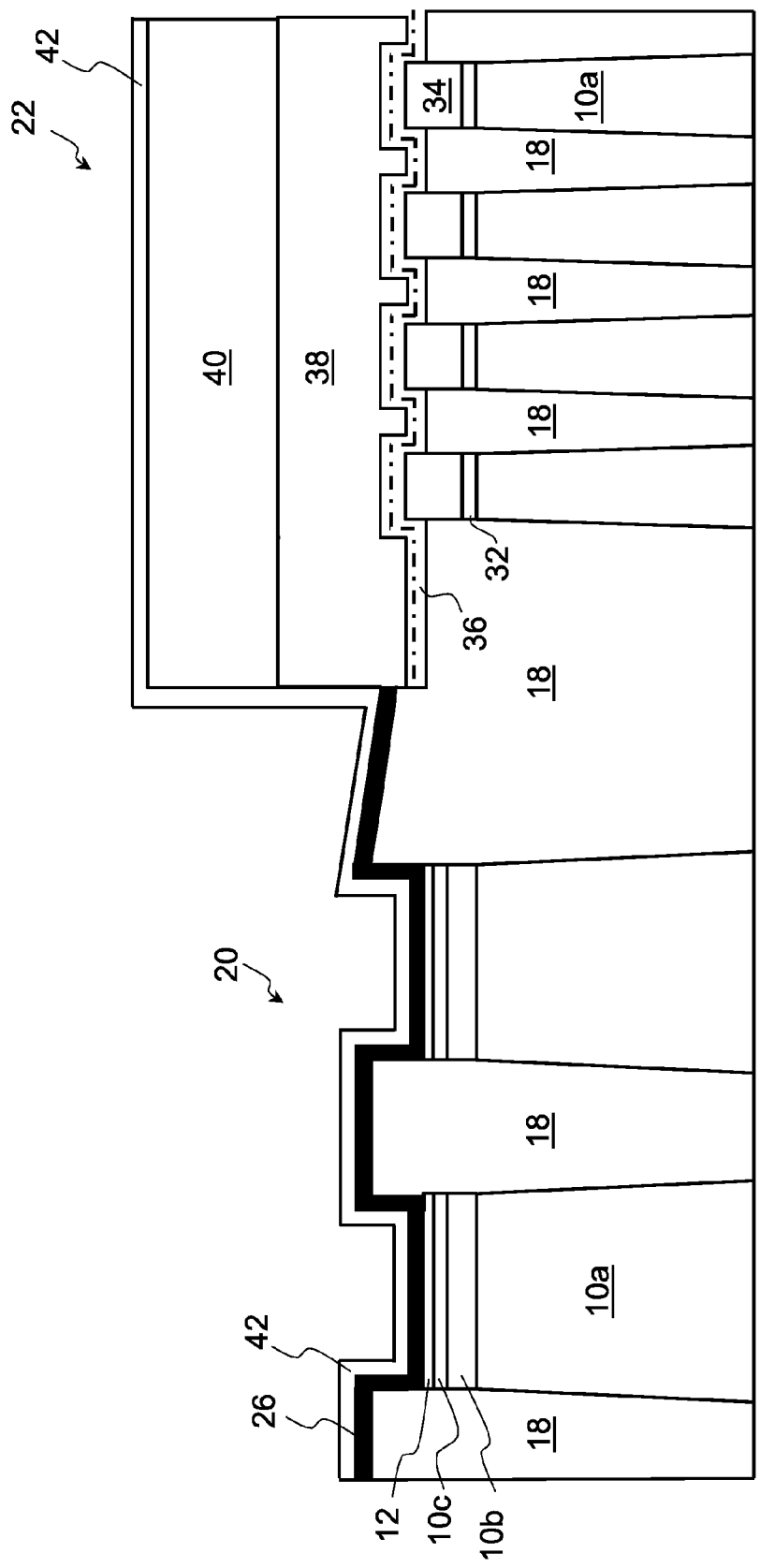
Figure 8B:
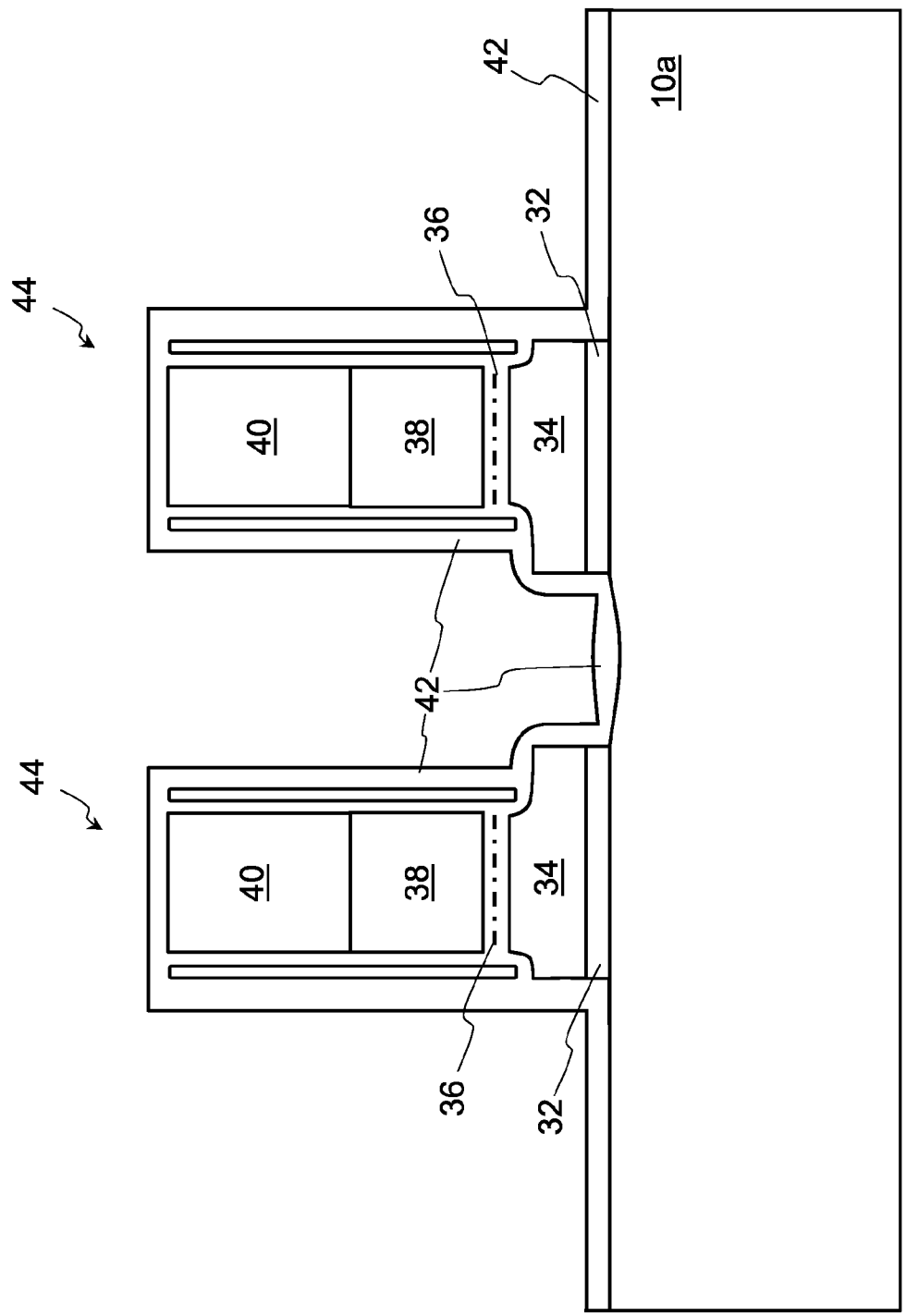
FIGS. 8B, 9B, 10B and 11B are side cross sectional views, orthogonal to those of FIGS. 8A, 9A, 10C and 11A respectively, of the memory area illustrating the next processing steps performed to manufacture the embedded memory device of the present invention.

A series of processing steps are next performed to complete the memory cell formation in the memory area 22, which are well known in the art. Specifically, poly 34 forms the floating gate. An optional oxide etch can be used to lower the tops of oxide 18 in the memory area 22. A composite insulating layer 36 (e.g. oxide/nitride/oxide) is formed over poly 34 and oxide 18. A conductive control gate 38 (e.g. polysilicon) is formed on the composite insulating layer 36 in the memory area 22, and a hard mask material 40 (e.g. a composite layer of nitride, oxide and nitride) is formed over the control gate 38. An oxide etch is used to remove layer 36 from the core logic area 20. A poly etch is then performed to remove poly 34 from the trenches 24 of core logic area 20. An insulating layer 42 (e.g. oxide) is then formed over the structure. FIGS. 8A and 8B show the resulting structure (FIG. 8B is a view orthogonal to that of FIG. 8A showing memory cells 44 being formed in the memory area 22).

Figure 9A:
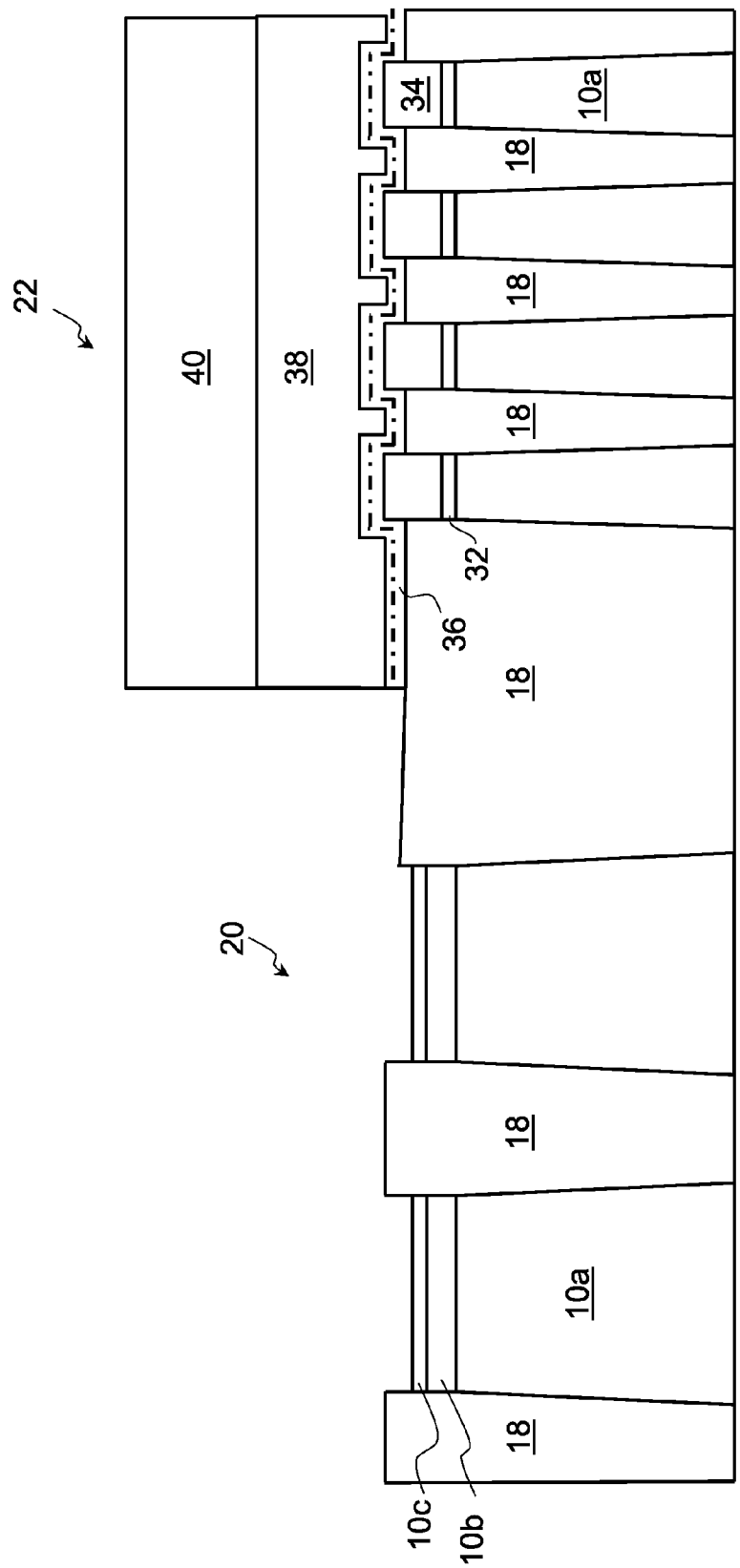
Figure 9B:
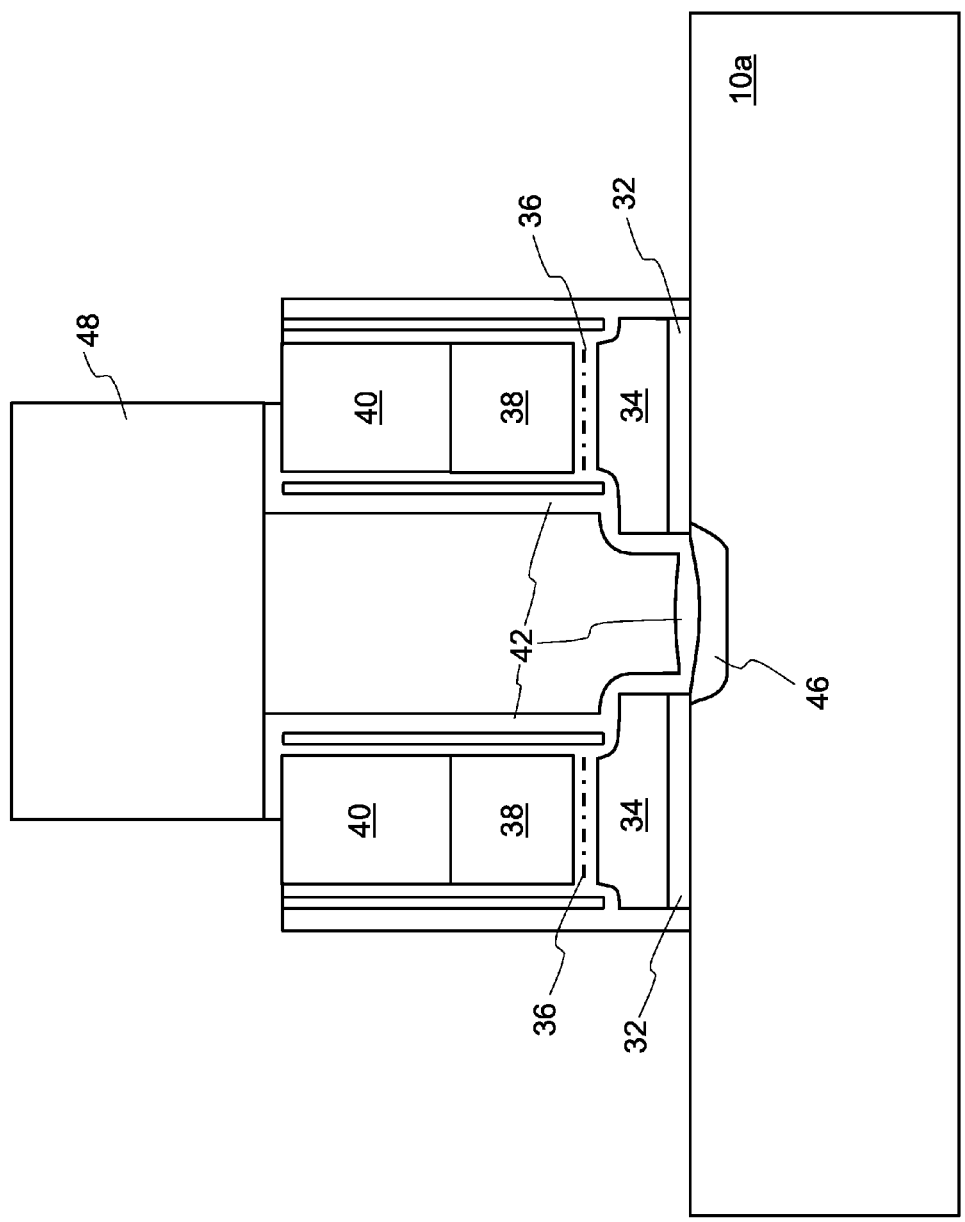

A source diffusion 46 is formed (e.g. implanted) in substrate 10a between adjacent floating gates 34 in the memory (e.g. using patterned photo resist to prevent implantation in other exposed areas of the substrate 10). Photo resist is then formed partially covering pairs of memory cells 44 (by photolithographic exposure and selective etch of the photo resist). Oxide and nitride etches are then performed to remove portions of oxide layers 42 and 12 and nitride layer 26 not protected by photo resist, as shown in FIGS. 9A and 9B (after the photoresist has been removed).

Figure 10A:
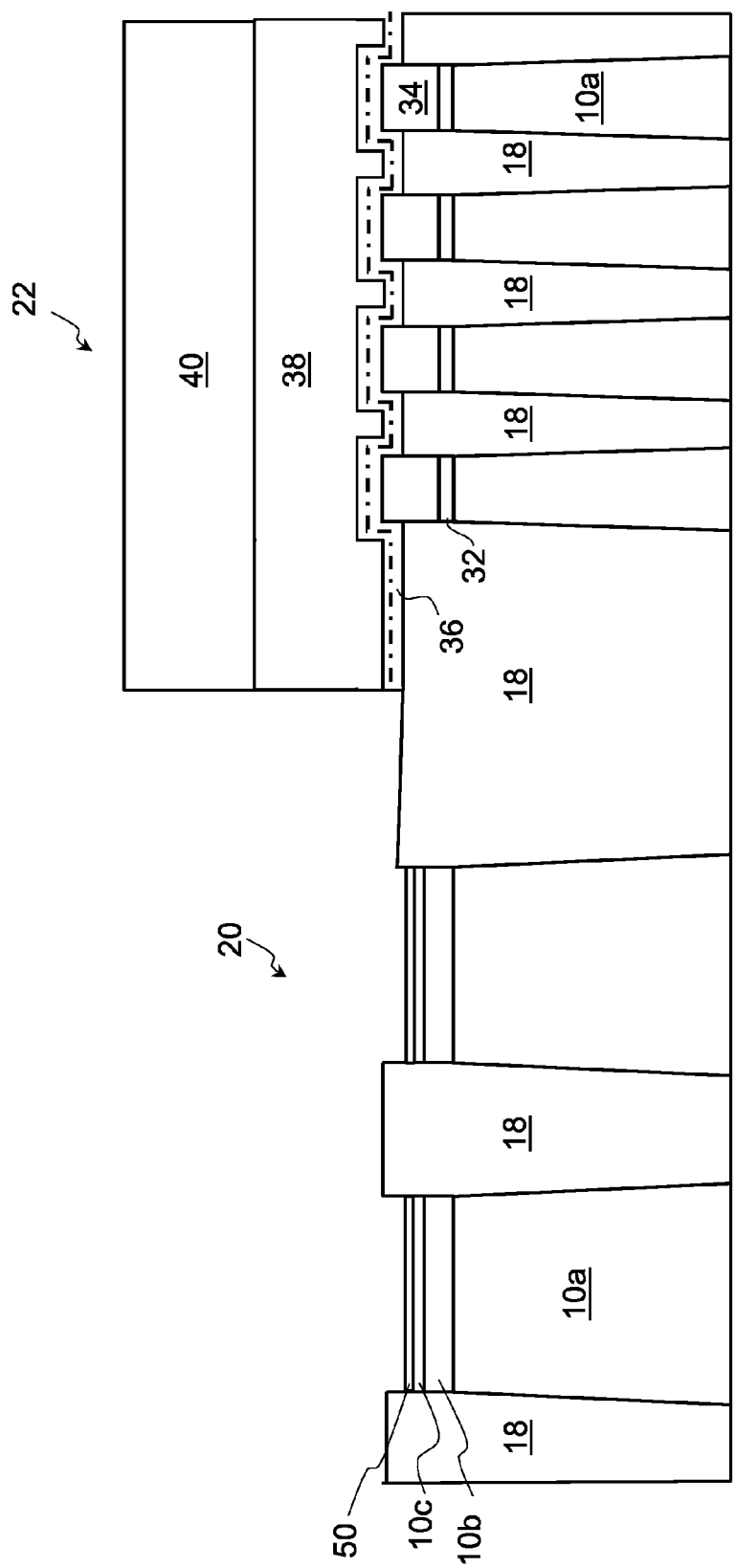
Figure 10B:
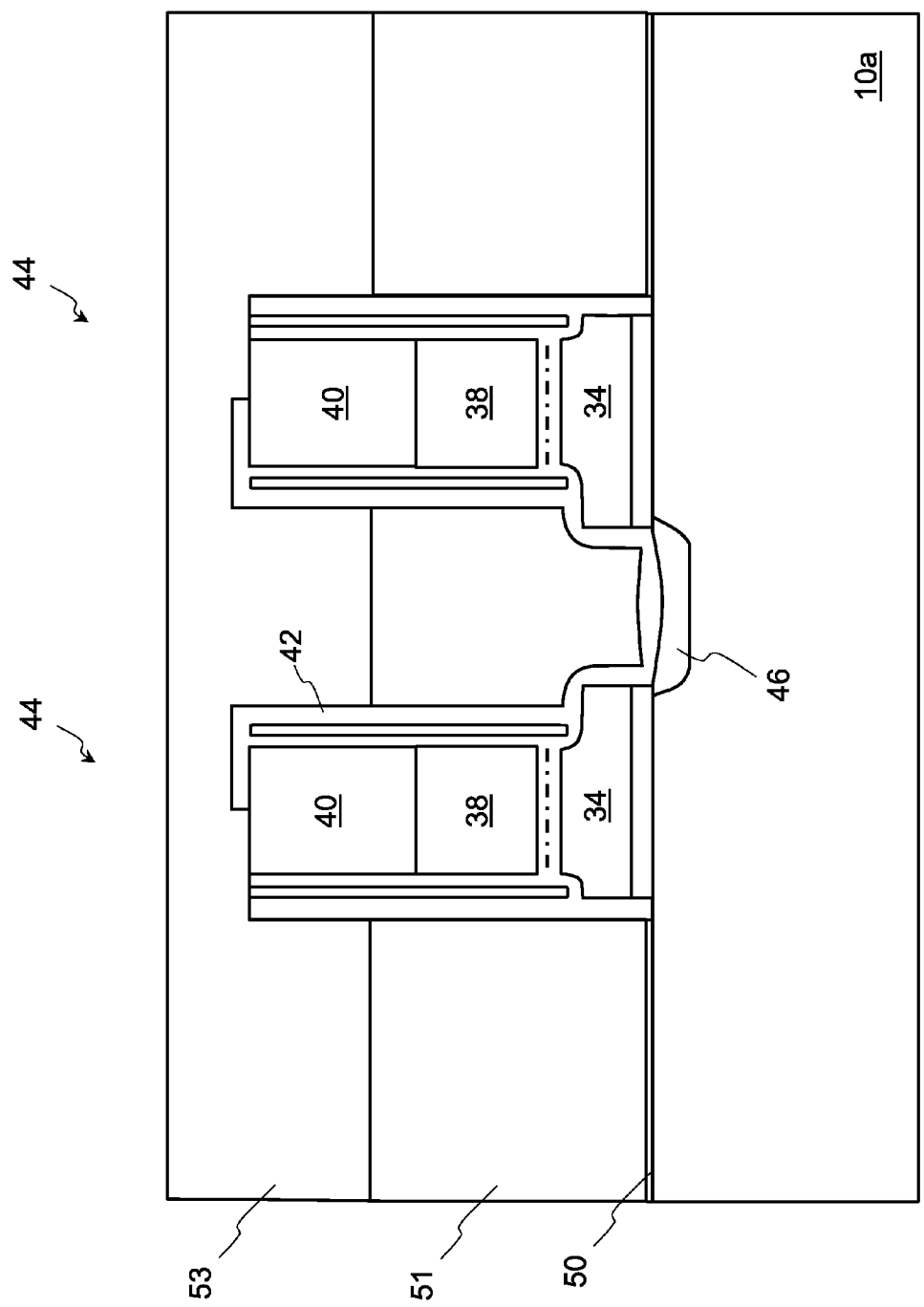

An insulation layer (e.g. oxide or oxynitride) 50 is then formed on the exposed silicon 10c in the trenches 24 of core logic area 20 and the exposed silicon 10a in the memory area 22, by for example thermal oxidation, as shown in FIG. 10A. Polysilicon is then deposited and etched back to form erase gates 52 over source regions 46 and word line (select) gates 54 on the other sides of floating gates 34 in the memory area 22, and poly gates 56 in the core logic area 20 (using photolithography patterning and etch processes). Preferably, the poly gates 52, 54 and 56 are formed as follows. First, polysilicon 51 is deposited over the structure. A protective insulator 70 such as oxide is deposited on the polysilicon 51. The protective oxide 70 is removed in the memory area 22 but not in the core logic area 20 using photolithographic and oxide etch processes. Dummy polysilicon 53 is then deposited over the structure, as illustrated in FIG. 10B for the memory area 22 and in FIG. 10C for the core logic of area 20. Poly CMP etch and etch back processes are used to form gates 52 and 54 in the memory area 22. The protective oxide 70 in the core logic area 20 prevents the poly etch and etch back processes from affecting the polysilicon 51 in the core logic region (once the dummy polysilicon 53 is removed). Then, photolithographic and etch processes are used to pattern the polysilicon 51 in the core logic area 20 to form poly gates 56, and to complete forming gates 54 in the memory area 22.

Figure 11A:
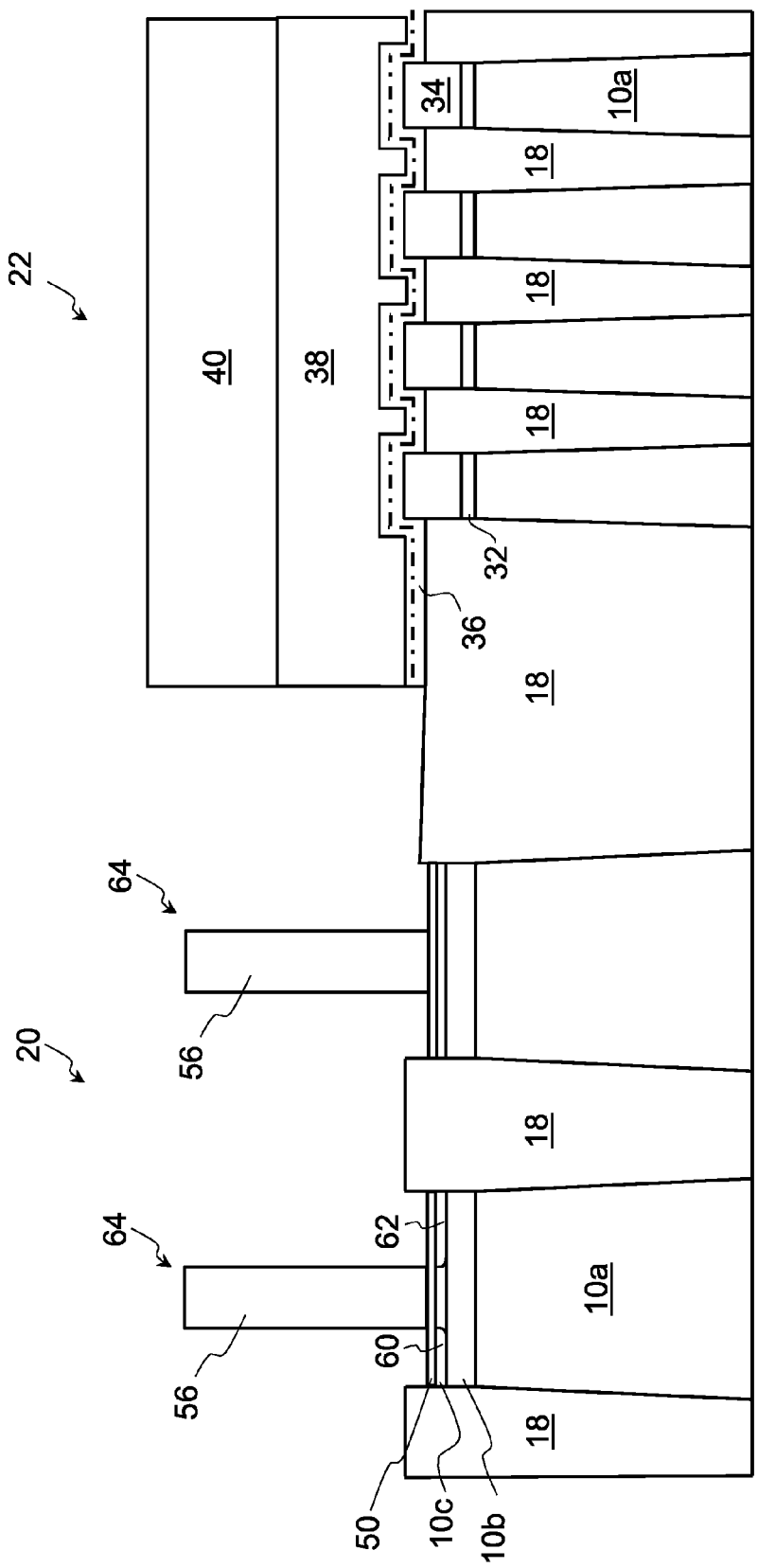
Figure 11B:
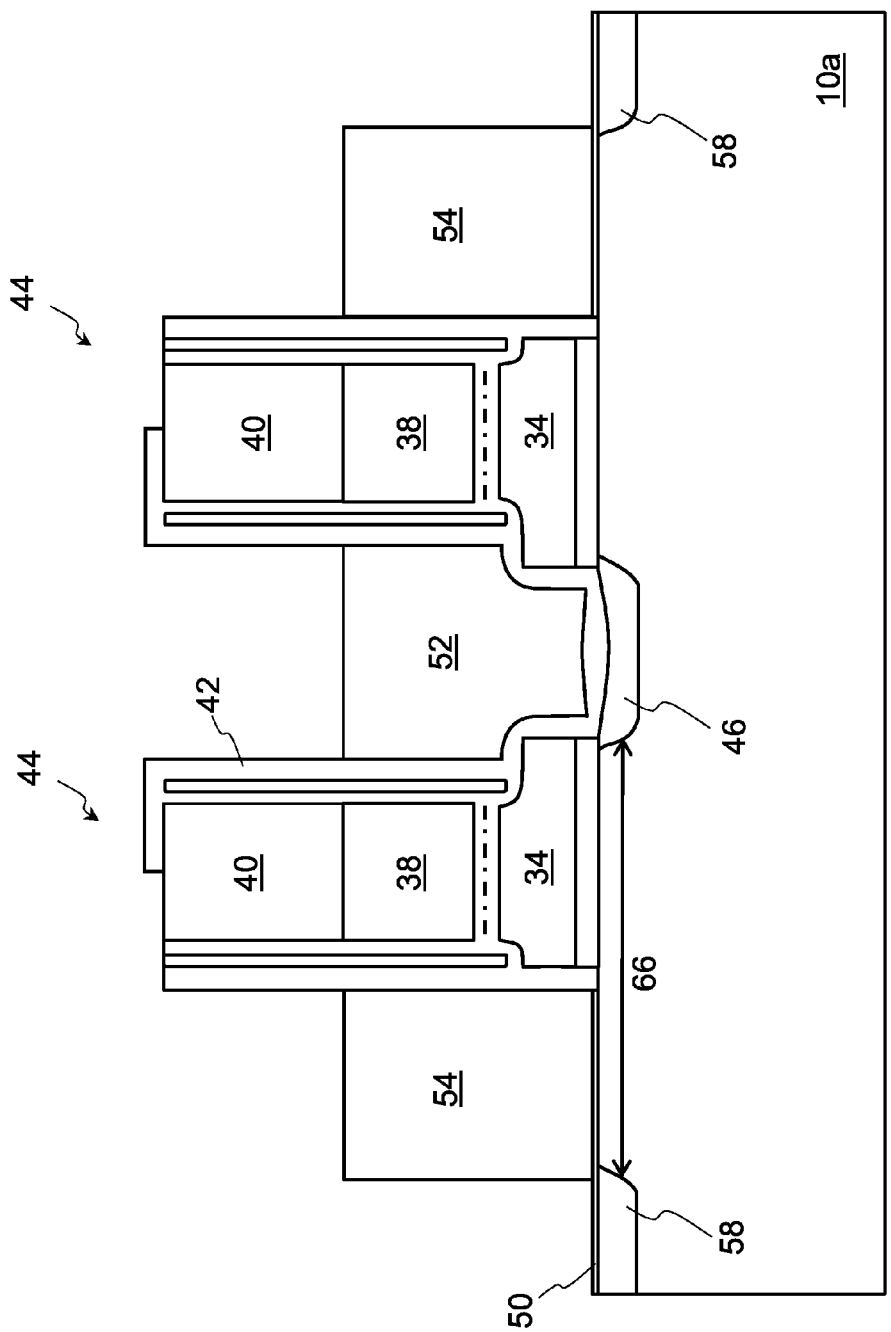

Implantation is next performed to form drain diffusion regions 58 in substrate 10a adjacent the select gates 54 in the memory area 22, and source and drain diffusion regions 60 and 62 in the thin silicon layer 10c to complete the logic devices 64 in the core logic area 20. The final structures are shown in FIGS. 11A and 11B (FIG. 11B is a view orthogonal to that of FIG. 11A).

In the memory area 22, the source and drain regions 46/58 define a channel region 66 therebetween, with the floating gate 34 disposed over and controlling a first portion of the channel region 66 and the select gate 54 disposed over and controlling a second portion of the channel region 66. The formation of these memory cells is known in the art (see U.S. Pat. Nos. 6,747,310, 7,868,375 and 7,927,994 incorporated herein by reference above) and not further described herein. The memory cells 44 each have a floating gate 34, control gate 38, source region 46, select gate 54, erase gate 52, and drain region 58. In the core logic area 20, each logic device 64 includes a conductive gate 56, source region 60 and drain region 62.

The above described manufacturing process forms memory cells 44 and core logic devices 64 on the same SOI substrate, where the embedded insulator layer 10b of the SOI substrate 10 is effectively removed from the memory area 22. This configuration allows the source and drain regions 46/58 of the memory cells 44 to extend deeper into the substrate than the source and drain regions 60/62 in the core logic area 20 (i.e. source/drain 46/58 can extend deeper than the thickness of silicon layer 10c and thus deeper than the top surface of insulation layer 10b in the core logic area 20, and even possibly deeper than the bottom surface of insulation layer 10*b* in the core logic area 20). The process also allows for the same polysilicon deposition process to form the erase and select gates 52/54 in the memory area 22 and the logic gates 56 in the core logic area 20.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell area and the core logic area of the present invention. Memory cell 44 can include additional or fewer gates than described above and illustrated in the figures. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a semiconductor device, comprising:
    providing a substrate that includes silicon, a first insulation layer directly over the silicon, and a layer of silicon directly over the first insulation layer;
    performing an etch process to remove the layer of silicon and the insulation layer from a second area of the substrate, while maintaining the first insulation layer and the layer of silicon in a first area of the substrate;
    forming a second layer of insulation over the layer of silicon in the first area of the substrate and over the silicon in the second area of the substrate;
    forming a first plurality of trenches in the first area of the substrate that each extends through the second layer of insulation, the layer of silicon, and the first insulation layer, and extends into the silicon;
    forming a second plurality of trenches in the second area of the substrate that each extends through the second layer of insulation, and extends into the silicon;
    forming insulation material in the first plurality of trenches and the second plurality of trenches;
    forming logic devices in the first area of the substrate, wherein the forming of each of the logic devices includes:
        forming spaced apart source and drain regions in the layer of silicon, and
        forming a conductive gate over and insulated from a portion of the layer of silicon and between the source and drain regions;
    forming memory cells in the second area of the substrate, wherein the forming of each of the memory cells includes:
        forming spaced apart second source and second drain regions in the silicon and defining a channel region therebetween,
        forming a floating gate over and insulated from a first portion of the channel region, and
        forming a select gate over and insulated from a second portion of the channel region.

2. The method of claim 1, wherein the second source and second drain regions formed in the second area extend deeper into the substrate than do the source and drain regions formed in the first area.

3. The method of claim 1, wherein the second source and second drain regions formed in the second area extend deeper into the substrate than a thickness of the layer of silicon in the first area.

4. The method of claim 1, further comprising:
    forming a third layer of insulation over the second layer of insulation, wherein the first plurality of trenches and the second plurality of trenches extend through the third layer of insulation.

5. The method of claim 1, wherein the forming of each of the memory cells further comprises:
    forming a control gate over and insulated from the floating gate; and
    forming an erase gate over and insulated from the second source region.

6. The method of claim 1, wherein the forming of each of the memory cells further comprises:
    forming an erase gate over and insulated from the second source region.

7. A method of forming a semiconductor device, comprising:
    providing a substrate that includes silicon, a first insulation layer directly over the silicon, and a layer of silicon directly over the first insulation layer;
    performing an etch process to remove the layer of silicon and the insulation layer from a second area of the substrate, while maintaining the first insulation layer and the layer of silicon in a first area of the substrate;
    forming a second layer of insulation over the layer of silicon in the first area of the substrate and over the silicon in the second area of the substrate;
    forming a first plurality of trenches in the first area of the substrate that each extends through the second layer of insulation, the layer of silicon, and the first insulation layer, and extends into the silicon;
    forming a second plurality of trenches in the second area of the substrate that each extends through the second layer of insulation, and extends into the silicon;
    forming insulation material in the first plurality of trenches and the second plurality of trenches;
    forming logic devices in the first area of the substrate, wherein the forming of each of the logic devices includes:
        forming spaced apart source and drain regions in the layer of silicon, and
        forming a conductive gate over and insulated from a portion of the layer of silicon and between the source and drain regions;
    forming memory cells in the second area of the substrate, wherein the forming of each of the memory cells includes:

forming spaced apart second source and second drain regions in the silicon and defining a channel region therebetween, forming a floating gate over and insulated from a first portion of the channel region, forming a select gate over and insulated from a second portion of the channel region, and forming an erase gate over and insulated from the second source region;

wherein the forming of the conductive gates, the select gates and the erase gates further comprises:

forming a first layer of polysilicon in the first and second areas of the substrate;

forming a third layer of insulation that is disposed on the first layer of polysilicon in the first area of the substrate but not disposed on the first layer of polysilicon in the second area of the substrate;

forming a second layer of polysilicon that is disposed on the third layer of insulation in the first area of the substrate and disposed on the first layer of polysilicon in the second area of the substrate;

performing a polysilicon etch that removes the second layer of polysilicon from the first and second areas of the substrate, and selectively removes portions of the first layer of polysilicon in the second area of the substrate to leave blocks thereof that constitute the erase gates and the select gates; and performing a second polysilicon etch that selectively removes portions of the first layer of polysilicon in the first area of the substrate to leave blocks thereof that constitute the conductive gates.

8. The method of claim 7, further comprising:

forming a third plurality of trenches in the first area of the substrate that are disposed between the insulation material in the first plurality of trenches by removing the third layer of insulation from the first area;

forming a fourth plurality of trenches in the second area of the substrate that are disposed between the insulation material in the second plurality of trenches by removing the third layer of insulation from the second area.

9. The method of claim 8, wherein:

each of the conductive gates is at least partially disposed in one of the third plurality of trenches;

each of the floating gates is at least partially disposed in one of the fourth plurality of trenches; and each of the select gates is at least partially disposed in one of the fourth plurality of trenches.

10. The method of claim 9, wherein the forming of each of the memory cells further comprises:

forming a control gate over and insulated from the floating gate; and forming an erase gate over and insulated from the source region and which is at least partially disposed in one of the fourth plurality of trenches.

* * * * *